(12) United States Patent
Herner

(10) Patent No.: US 7,648,896 B2
(45) Date of Patent: Jan. 19, 2010

(54) DEPOSITED SEMICONDUCTOR STRUCTURE TO MINIMIZE N-TYPE DOPANT DIFFUSION AND METHOD OF MAKING

(75) Inventor: S. Brad Herner, San Jose, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 12/181,317

(22) Filed: Jul. 28, 2008

(65) Prior Publication Data
US 2009/0026582 A1 Jan. 29, 2009

Related U.S. Application Data

(63) Continuation of application No. 11/298,331, filed on Dec. 9, 2005, now Pat. No. 7,405,465, which is a continuation-in-part of application No. 10/954,577, filed on Sep. 29, 2004, now Pat. No. 7,224,013.

(51) Int. Cl.
*H01L 21/04* (2006.01)
(52) U.S. Cl. .......................... 438/510; 438/549
(58) Field of Classification Search ............. 438/510, 438/549, 558, 560, 566
See application file for complete search history.

(56) References Cited

U.S. PATENT DOCUMENTS 6,162,711 A * 12/2000 Ma et al. .................. 438/558
6,879,014 B2 4/2005 Wagner et al.
6,951,780 B1 10/2005 Herner
6,952,030 B2 10/2005 Herner et al.

(Continued)

FOREIGN PATENT DOCUMENTS

DE 43 19 211 A1 12/1994

(Continued)

OTHER PUBLICATIONS

Bang, David S. ,et al., "Resistivity of boron and phosphorous doped polycrystalline Si1-xGex films", Appl. Phys. Lett. 66 (2) Jan. 9, 1995, (Jan. 1995), 195-197.

(Continued)

*Primary Examiner*—Mark Prenty
(74) *Attorney, Agent, or Firm*—Dugan & Dugan, PC (57) ABSTRACT

In deposited silicon, n-type dopants such as phosphorus and arsenic tend to seek the surface of the silicon, rising as the layer is deposited. When a second undoped or p-doped silicon layer is deposited on n-doped silicon with no n-type dopant provided, a first thickness of this second silicon layer nonetheless tends to include unwanted n-type dopant which has diffused up from lower levels. This surface-seeking behavior diminishes when germanium is alloyed with the silicon. In some devices, it may not be advantageous for the second layer to have significant germanium content. In the present invention, a first heavily n-doped semiconductor layer (preferably at least 10 at % germanium) is deposited, followed by a silicon-germanium capping layer with little or no n-type dopant, followed by a layer with little or no n-type dopant and less than 10 at % germanium. The germanium in the first layer and the capping layer minimizes diffusion of n-type dopant into the germanium-poor layer above.

19 Claims, 5 Drawing Sheets

U.S. PATENT DOCUMENTS

| | | |
|---|---|---|
| 7,176,064 B2 | 2/2007 | Herner |
| 7,224,013 B2 | 5/2007 | Herner et al. |
| 7,265,049 B2 | 9/2007 | Herner et al. |
| 7,405,465 B2 | 7/2008 | Herner |
| 2003/0164491 A1 | 9/2003 | Lee |
| 2005/0052915 A1 | 3/2005 | Herner et al. |
| 2005/0098800 A1 | 5/2005 | Herner et al. |
| 2005/0226067 A1 | 10/2005 | Herner et al. |
| 2006/0067117 A1 | 3/2006 | Petti |
| 2006/0073657 A1 | 4/2006 | Herner et al. |
| 2006/0250836 A1 | 11/2006 | Herner et al. |
| 2007/0102724 A1 | 5/2007 | Kumar et al. |

FOREIGN PATENT DOCUMENTS

| | | |
|---|---|---|
| JP | 2004111821 | 4/2004 |

OTHER PUBLICATIONS

King, Tsu-Jae., et al., "Polycrystalline Silicon-Germanium Thin Film Transistors", IEEE Transactions on Electron Devices, vol. 41, No. 9, (Sep. 1994), 1581-1591.

Singh, D.V., et al ., "Abrupt phosphorous profiles in Si: Effects of temperature and substitutional carbon on phosphorous autodoping", J. Electrochem. Soc. 150, (2003), G553-G556.

Thompson, P.E., et al., "Formation of p+ Shallow Junctions using SiGe barriers", J. Vac. Sci. Tech. B 22, (2004), 2333-2336.

Yang, M., et al., "Phosphorous doping and sharp profiles in silicon and silicon-germanium epitaxy by rapid thermal chemical vapor deposition", J. Electrochem. Soc. 147, (2000), 3541-3545.

International Preliminary Report on Patentability of International Application No. PCT/US2006/046133, mailed Jun. 19, 2008.

International Search Report and Written Opinion of International Application No. PCT/US2006/046133, mailed Mar. 22, 2007.

Office Action of European Application No. 06 838 859.4, dated Mar. 11, 2009.

Notice of Allowance of U.S. Appl. No. 10/954,577, mailed Mar. 23, 2007.

Office Action of U.S. Appl. No. 10/954,577, mailed Sep. 20, 2006.

Reply to Sep. 20, 2006 Office Action of U.S. Appl. No. 10/954,577.

Notice of Allowance of U.S. Appl. No. 11/298,331, mailed Mar. 24, 2008.

Office Action of U.S. Appl. No. 11/298,331, mailed Sep. 14, 2007.

Reply to Sep. 14, 2007 Office Action of U.S. Appl. No. 11/298,331.

Office Action of related Chinese Patent Application No. 200680052354.4, dated Jun. 30, 2009.

Nov. 3, 2009 Reply to Jul. 3, 2009 Office Action of Chinese Patent Application No. 200680052354.4.

* cited by examiner

DEPOSITED SEMICONDUCTOR STRUCTURE TO MINIMIZE N-TYPE DOPANT DIFFUSION AND METHOD OF MAKING

RELATED APPLICATION

This application is a continuation of Herner et. al, U.S. application Ser. No. 11/298,331, titled "Deposited Semiconductor Structure to Minimize N-Type Dopant Diffusion and Method of Making" and filed Dec. 9, 2005, now U.S. Pat. No. 7,405,465 which is a continuationin-part of Herner et al., U.S. application Ser. No. 10/954,577, titled "Junction Diode Comprising Varying Semiconductor Compositions" and filed Sep. 29, 2004, hereinafter the '577 application (now U.S. Pat. No. 7,224,013). Each of these applications is hereby incorporated by reference in its entirety for all purposes.

BACKGROUND OF THE INVENTION

The invention relates to a deposited vertical semiconductor layerstack that serves to minimize surfactant behavior of n-type dopants, and the methods of making the layerstack.

During deposition of silicon, n-type dopants such as phosphorus and arsenic tend to seek the surface, rising through a silicon layer as it is deposited. If it is desired to deposit a layer having little or no n-dopant (an undoped or p-doped layer, for example) immediately above a heavily doped n-type layer, this tendency of n-type dopant atoms to diffuse toward the surface introduces unwanted dopant into the undoped or p-doped layer. This unwanted n-type dopant may adversely affect device behavior.

There is a need, therefore, to limit diffusion of n-type dopants in deposited silicon and silicon alloys.

SUMMARY OF THE PREFERRED EMBODIMENTS

The present invention is defined by the following claims, and nothing in this section should be taken as a limitation on those claims. In general, the invention is directed to a structure and method to limit n-type dopant diffusion in a deposited semiconductor layerstack.

A first aspect of the invention provides for a semiconductor device comprising a layerstack, the layerstack comprising: a first layer of deposited heavily n-doped semiconductor material above a substrate, the first layer at least about 50 angstroms thick; a second layer of semiconductor material which is not heavily n-doped, wherein the semiconductor material of the second layer is a silicon-germanium alloy that is at least 10 at % germanium, the second layer at least about 100 angstroms thick, wherein the second layer is above and in contact with the first layer; and a third layer of deposited semiconductor material which is not heavily n-doped above and in contact with the second layer, wherein the semiconductor material of the third layer is silicon or a silicon-germanium alloy that is less than 10 at % germanium, wherein the first, second, and third layers reside in a semiconductor device.

Another aspect of the invention provides for a nonvolatile memory cell formed above a substrate, the memory cell comprising: a portion of a bottom conductor above the substrate; a portion of a top conductor above the bottom conductor; and a diode vertically disposed between the bottom conductor and the top conductor, the diode comprising: i) a first deposited layer of heavily n-doped semiconductor material; ii) a second deposited layer of semiconductor material which is not heavily n-doped wherein the semiconductor material of the second layer is a silicon-germanium alloy that is at least 10 at % germanium, the second layer disposed above and in contact with the first layer; and iii) a third deposited layer of semiconductor material which is not heavily n-doped, wherein the semiconductor material of the third layer is silicon or a silicon-germanium alloy that is less than 10 at % germanium, wherein the third layer is above and in contact with the second layer.

A preferred embodiment of the invention provides for a method for forming a first memory level above a substrate, the method comprising: depositing a first layer of heavily n-doped semiconductor material; depositing a second layer of lightly n-doped, p-doped, or undoped semiconductor material on and in contact with the first layer, wherein the semiconductor material of the second layer is a silicon-germanium alloy that is at least 10 at % germanium, depositing a third layer of lightly n-doped, p-doped, or undoped semiconductor material on and in contact with the first layer, wherein the semiconductor material of the third layer is silicon or a silicon-germanium alloy that is less than 10 at % germanium; and patterning and etching the first, second, and third layers to form a first plurality of vertically oriented diodes in the form of pillars.

A related embodiment provides for a monolithic three dimensional memory array comprising: a) a first memory level formed above a substrate, the first memory level comprising: i) a plurality of substantially parallel, substantially coplanar bottom conductors; ii) a plurality of substantially parallel, substantially coplanar top conductors; iii) a plurality of semiconductor junction diodes, each diode vertically disposed between one of the bottom conductors and one of the top conductors, wherein each diode comprises a first layer of heavily n-doped semiconductor material, a second layer of lightly n-doped, p-doped, or undoped silicon-germanium alloy wherein the second layer is at least 10 at % germanium, the second layer above the first layer, and a third layer of lightly n-doped, p-doped or undoped silicon or silicon-germanium alloy wherein the third layer is less than 10 at % germanium, the third layer above the second layer; and b) at least a second memory level monolithically formed above the first memory level.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
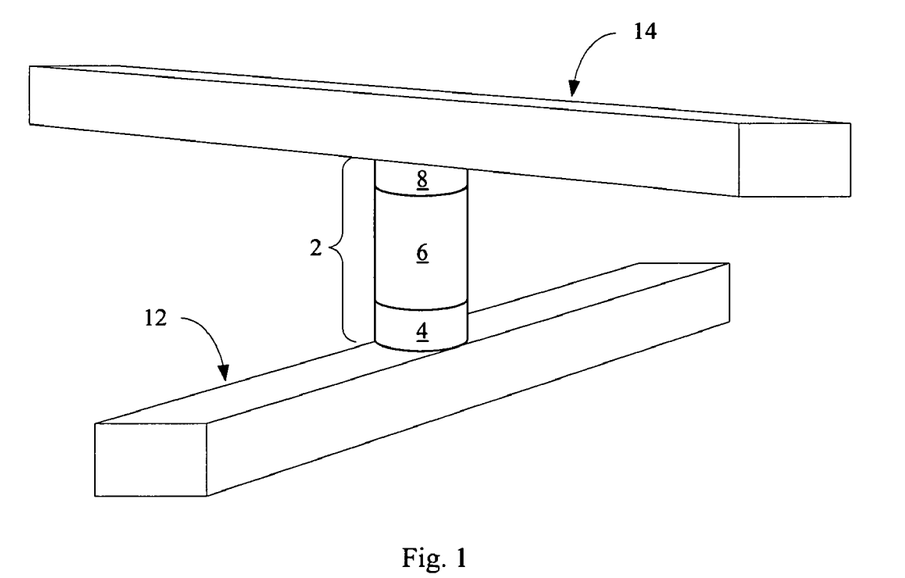
FIG. 1 a perspective view of a vertically oriented diode which may benefit from use of the structures and methods of the present invention.

Semiconductor devices are doped with p-type and n-type dopants to enhance conductivity. Most semiconductor devices require sharp transitions in dopant profiles. For example, FIG. 1 shows a vertically oriented p-i-n diode 2, formed of polycrystalline silicon (in this discussion, polycrystalline silicon will be referred to as polysilicon.) The diode is formed between bottom conductor 12 and top conductor 14. Bottom region 4 is heavily doped with an n-type dopant, such as phosphorus or arsenic, middle region 6 is intrinsic polysilicon, which is not intentionally doped, and top region 8 is heavily doped with a p-type dopant such as boron or $BF_2$. (Many other semiconductor devices, including p-n diodes, Zener diodes, thyristors, bipolar transistors, etc., include regions having different doping characteristics. The p-i-n diode 2 of FIG. 1 is presented as an example.) The difference in doping characteristics between these different regions must be maintained for the device to function.

Dopants can be introduced into semiconductor material such as silicon by several methods, including ion implantation or diffusion from a nearby dopant source. If the silicon is deposited, it can be doped in situ, by flowing a gas that will provide the dopant during deposition, so that dopant atoms are incorporated into the silicon as it is deposited.

Most n-type dopants, such as phosphorus and arsenic, exhibit surfactant behavior, a strong preference to be located on the surface of deposited silicon, rather than buried. Referring to FIG. 1, heavily doped n-type region 4 can be formed by flowing $SiH_4$, a typical precursor gas to deposit silicon, along with $PH_3$, which will provide phosphorus. To form intrinsic region 6, the flow of $PH_3$ is stopped, while $SiH_4$ flow continues. The silicon of region 6 is deposited without dopant, but phosphorus from region 4 diffuses into region 6 during deposition. A significant thickness of silicon must be deposited to guarantee that a sufficient thickness of region 6 is formed which includes virtually no n-type dopant. Unwanted dopant diffusion from heavily doped region 4 to intrinsic region 6 makes it difficult to form a sharp junction between these regions, and may force the overall height of the diode 2 to be more than desired.

The surfactant behavior of n-type dopants is less in a silicon-germanium alloy than in silicon, and decreases as the germanium content of the alloy increases. In a silicon-germanium alloy which is at least about 10 at % germanium, preferably at least about 20 at % germanium, the tendency of n-type dopants to seek the surface during in situ deposition is significantly reduced.

Figure 2:
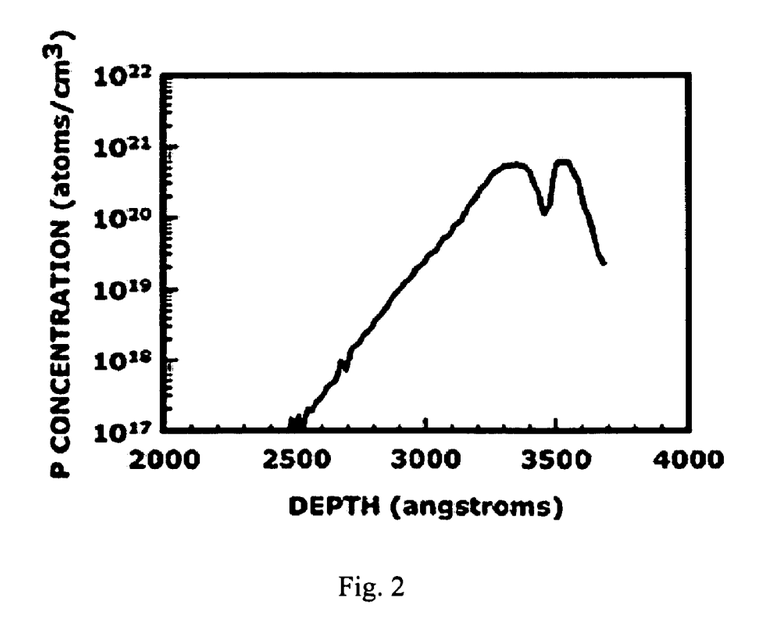
FIG. 2 is a graph showing phosphorus concentration at depth in a deposited silicon layer.

FIG. 2 is a graph showing phosphorus concentration in silicon over a depth range, measured in angstroms from the top surface labeled 0 angstroms, to approximately 3500 angstroms, which represents the bottom or initial surface of deposition of an in situ doped deposited layer. In this silicon layer, $PH_3$ was flowed during initial silicon deposition at 3450 angstroms to a depth of 3250 angstroms. At this depth the flow of $PH_3$ was stopped, while $SiH_4$ flow was continued, depositing nominally undoped silicon on top of the heavily n-doped silicon. As shown in FIG. 2, however, the concentration of phosphorus nonetheless remains above $5 \times 10^{17}$ atoms/$cm^3$ to a depth of about 2650 angstroms, after an additional 700 angstroms of silicon has been deposited with no dopant provided.

Figure 3:
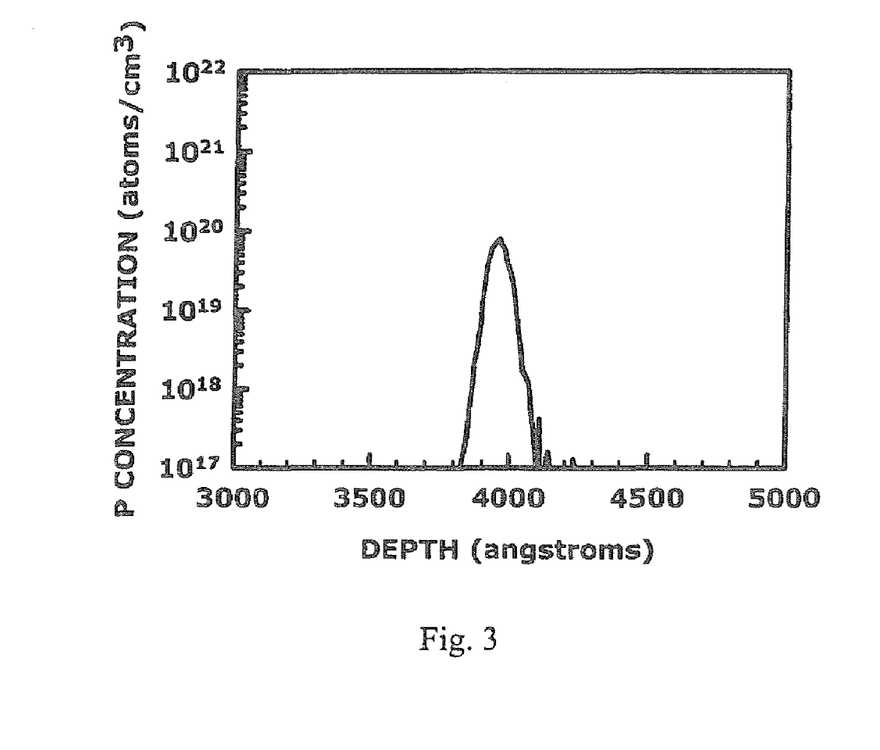
FIG. 3 is a graph showing phosphorus concentration at depth in a deposited silicon-germanium layer.

FIG. 3 is a graph showing phosphorus concentration in deposited silicon-germanium. During deposition of this layer, flow of $PH_3$ started at a depth of 4050 angstroms, forming a heavily doped n-type silicon layer, and was stopped at a depth of 3900 angstroms. The concentration of phosphorus drops to about $5 \times 10^{17}$ atoms/$cm^3$ at a depth of about 3850 angstroms, after an additional thickness of only about 50 angstroms of silicon-germanium has been deposited.

Thus if the diode 2 of FIG. 1 is formed of a silicon-germanium alloy, for example $Si_{0.8}Ge_{0.2}$, diffusion of dopant from n-doped region 4 to intrinsic region 6 will be significantly curtailed, and a sharp junction between these regions can be formed.

Germanium has a smaller band gap than silicon, however, and increasing the germanium content of intrinsic region 6 causes the diode to have a relatively high leakage current under reverse bias. A diode is used for its rectifying behavior—its tendency to conduct more readily in one direction than in the opposite direction—and leakage current in the reverse direction is generally undesirable.

In short, when the diode is formed of silicon, unwanted n-type dopant in intrinsic region 6 causes increased reverse leakage current. This dopant diffusion due to surfactant behavior can be reduced by forming the diode of a silicon-germanium alloy, but this alternative is also unsatisfactory, since the smaller band gap of this material also leads to higher leakage current.

Figure 4:
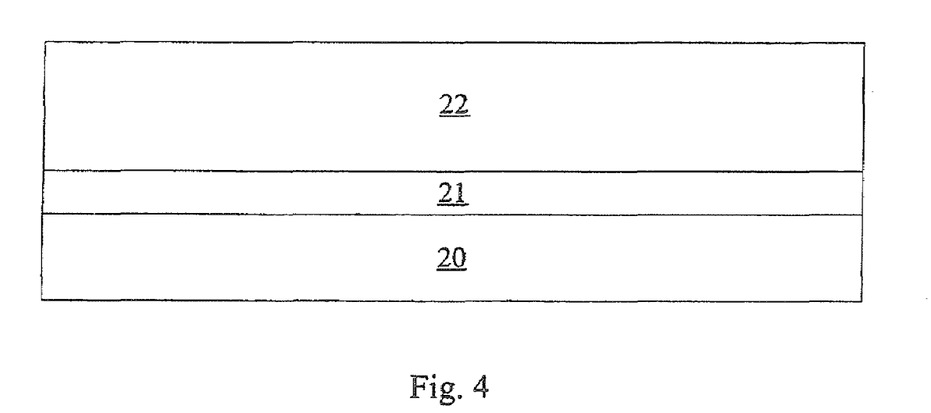
FIG. 4 is a cross-sectional view of a semiconductor layerstack according to aspects of the present invention.

This problem is addressed in the present invention by varying the germanium content within the layerstack. Turning to FIG. 4, in the present invention, in a deposited semiconductor layerstack, a first layer 20 of semiconductor material is heavily doped with an n-type dopant, such as phosphorus or arsenic, for example having a dopant concentration of at least about $5 \times 10^{19}$ dopant atoms/$cm^3$. Layer 20 may have been doped in situ during deposition or by ion implantation. Next a thin capping layer 21 of silicon-germanium which is at least about 10 at % germanium, preferably at least about 20 at % germanium, is deposited immediately on and in contact with the first layer 20. Capping layer 21 has a very low concentration of n-type dopant. It is undoped or very lightly doped with n-type dopant, having an n-type dopant concentration no more than about $5 \times 10^{17}$ dopant atoms/$cm^3$; capping layer 21 may be doped with a p-type dopant. Capping layer 21 is relatively thin, for example about 100 and or 200 angstroms, preferably no more than about 300 to about 500 angstroms thick. A second layer 22 of silicon or a silicon-germanium alloy which is poor in germanium, for example less than 10 at % germanium, preferably less than 5 at % germanium, preferably no germanium, is deposited above and in contact with the capping layer. Second layer 22 is undoped or very lightly doped with an n-type dopant, having an n-type dopant concentration no more than about $5 \times 10^{17}$ dopant atoms/$cm^3$. Second layer 22 may be doped with a p-type dopant. The entire layerstack, layers 20, 21, and 22, is deposited semiconductor material. Depending on deposition conditions, the layerstack may be amorphous or polycrystalline as deposited, or portions of the layerstack may be amorphous while other portions are polycrystalline.

Silicon-germanium capping layer 21 has a very low n-type dopant concentration, and a germanium content high enough to ensure that very little n-type dopant from heavily doped layer 20 migrates through it. Thus the top surface of silicon-germanium capping layer 21, upon which germanium-poor second layer 22 is deposited, will have virtually no n-type dopant atoms, and a sharp transition in dopant profile can be achieved.

In preferred embodiments, layer 20 is a silicon-germanium alloy which is at least 10 at % germanium, preferably at least 20 at % germanium. Higher germanium content layer 20 tends to further reduce surfactant behavior. Fabrication of the layerstack is simplified if layers 20 and 21 are the same silicon-germanium alloy. If desired, however, layer 20 could be silicon, a silicon-germanium alloy which is less than 10 at % germanium, or some other semiconductor material.

Figure 5A:
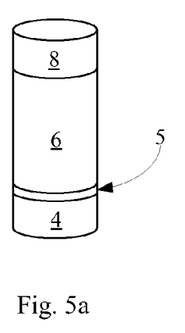
FIGS. 5a-5h are perspective views of vertically oriented diodes formed according to embodiments of the present invention.

Turning to FIG. 5a, in a first embodiment, using methods of the present invention, a low-leakage, vertically oriented p-i-n diode can be formed. Heavily doped layer 4 is heavily doped with an n-type dopant, for example by in situ doping or ion implantation. Heavily doped layer 4 is preferably a silicon-germanium alloy which is at least 10 at % germanium, preferably at least 20 at % germanium. Some germanium content in heavily doped layer 4 is advantageous, limiting surfactant behavior and providing a better electrical contact to an adjacent conductor. In less preferred embodiments, however, heavily doped layer 4 may be silicon, a silicon-germanium alloy which is less than 10 at % germanium, or some other semiconductor material. Capping layer 5 is a silicon-germanium alloy which is at least 10 at %, preferably at least 20 at % germanium, and is undoped or lightly doped with an n-type dopant, having a dopant concentration less than about $5 \times 10^{17}$ atoms/cm$^3$. Intrinsic layer 6 is silicon or a germanium-poor silicon-germanium alloy, no more than about 10 at % germanium, preferably no more than about 5 at % germanium, most preferably with substantially no germanium. A top layer 8 of heavily doped p-type semiconductor material, preferably silicon, can be formed above intrinsic layer 6, for example by ion implantation, to complete the diode. In the completed device, layers 4, 5, 6, and 8 are preferably polycrystalline.

Figure 5B:
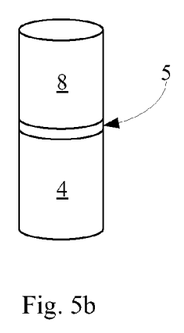

Turning to FIG. 5b, in another embodiment, methods of the present invention can be used to form a vertically oriented p-n diode having a sharp dopant transition. Heavily doped layer 4 is a semiconductor material and is heavily doped with an n-type dopant, for example by in situ doping or by ion implantation. As in the diode of FIG. 5a, this layer is preferably a silicon-germanium alloy which is at least 10 at % germanium, preferably at least 20 at % germanium, though in less preferred embodiments it may be some other semiconductor material, for example silicon or a silicon-germanium alloy which is less than 10 at % germanium. Capping layer 5 is a silicon-germanium alloy which is at least 10 at % germanium, preferably at least 20 at % germanium, and is undoped, or lightly doped with an n-type dopant, having a dopant concentration less than about $5 \times 10^{17}$ atoms/cm$^3$, or is heavily doped with a p-type dopant. Top layer 8 of heavily doped p-type silicon or a germanium-poor silicon-germanium alloy, no more than about 10 at % germanium, preferably no more than about 5 at % germanium, most preferably with substantially no germanium, and is formed above capping layer 5 to complete the diode. In the completed device, layers 4, 5, and 8 are preferably polycrystalline.

The vertically oriented diodes shown in FIGS. 5a and 5b are examples; the methods of the present invention can be used in other semiconductor devices requiring a sharp transition in dopant profile from a deposited heavily n-doped layer to a layer that is not heavily doped with an n-type dopant deposited above it; specifically in devices in which it is preferred that the layer which is not heavily n-doped has little or no germanium.

Figure 5C:
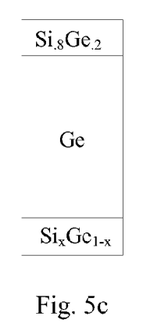
Figure 5D:
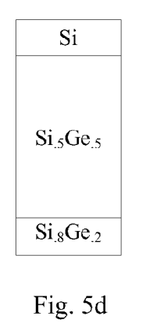
Figure 5E:
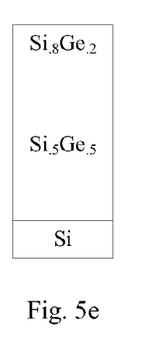
Figure 5F:
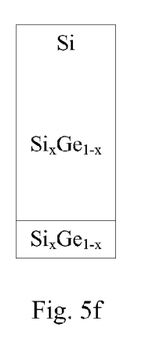
Figure 5G:
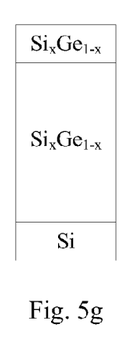

Turning to FIGS. 5c-5h, a series of preferred embodiments is illustrated. In FIG. 5c, the bottom heavily doped region is $Si_xGe_{1-x}$ where 1>x>0, the middle lightly doped or intrinsic region is germanium, and the top heavily doped region is $Si_{0.8}Ge_{0.2}$. In FIG. 5d, the bottom heavily doped region is $Si_{0.8}Ge_{0.2}$, the middle lightly doped or intrinsic region is $Si_{0.5}Ge_{0.5}$, and the top heavily doped region is silicon. In FIG. 5e, the bottom heavily doped region is silicon, the middle lightly doped or intrinsic region is $Si_{0.5}Ge_{0.5}$, and the top heavily doped region is $Si_{0.8}Ge_{0.2}$. In FIG. 5f, the bottom heavily doped region and the middle lightly doped or intrinsic region are $Si_xGe_{1-x}$ where 1>x>0 and the top heavily doped region is silicon. In FIG. 5g, the bottom heavily doped region is silicon, and the middle lightly doped or intrinsic region and the top region are $Si_xGe_{1-x}$ where 1>x>0. Any of these semiconductor compositions can be combined with any of the dopant configurations (P+N−N+, P+P−N+, etc.) mentioned earlier.

In these exemplary embodiments, the proportion of germanium in the middle region is higher than the proportion of germanium in either the top region, the bottom region or both. This allows higher carrier mobility in the lightly doped or intrinsic region, where the most benefit will occur. Alternatively, these exemplary embodiments also show in general that the proportion of silicon may be higher in the top region than in either the bottom or the middle region. A lower proportion of germanium in the top region allows for growth of an oxide containing a higher proportion of silicon oxide than germanium oxide, producing a higher quality oxide antifuse. Thus additional preferred embodiments of the present invention provide for a memory cell comprising a semiconductor pillar, the pillar comprising a heavily doped bottom region of a first conductivity type; a heavily doped top region of a second conductivity type; and a lightly doped or intrinsic middle region interposed between and contacting the top and bottom regions, wherein the middle region comprises a first proportion of germanium and the top region or bottom region either comprises no germanium or comprises a second proportion of germanium less then the first proportion.

It has been described that higher silicon content in the top region of the junction diode allows for growth of a higher quality oxide antifuse. In embodiments in which no antifuse is to be grown, or in which the antifuse is deposited or formed below the junction diode in contact with the bottom conductor, this advantage becomes less important. For example, an antifuse may be formed disposed between the bottom conductor and the bottom region of the junction antifuse.

Figure 5H:
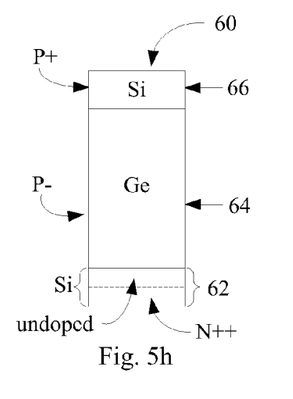

It has been noted that diffusion of n-type dopants is faster in germanium than in silicon. Thus there is a danger that dopants from a predominantly silicon heavily n-doped region will diffuse into an adjacent lightly doped or intrinsic region with a higher proportion of germanium, with potentially deleterious effect on device performance. Suppose, for example, junction diode 60 of FIG. 5h is ultimately to be a diode having a bottom heavily doped n-type region 62 of silicon about 400 angstroms thick, a middle lightly doped p-type region 64 of germanium about 2500 angstroms thick and a top heavily doped p-type region 66 of silicon about 200 angstroms thick. To prevent inadvertent dopant diffusion from the bottom heavily n-doped silicon region into the adjacent middle lightly doped p-type germanium region 64, it may be advantageous to dope, for example, the bottom 200 angstroms of region 62 very heavily (indicated as N++ in FIG. 5h), for example at a dopant concentration of between about $2 \times 10^{19}$ to about $4 \times 10^{21}$ atoms/cm$^3$, preferably about $1 \times 10^{21}$ atoms/cm$^3$. The remaining 200 angstroms of region 62 is undoped silicon as deposited. Next middle region 64 is formed, in this example of germanium, also undoped. Top region 66 is formed of undoped silicon. After pattern, etch, fill, and planarization, top region 66 is heavily doped with p-type dopants using ion implantation. Alternatively, top region 66 could have been in-situ doped with p-type dopants during deposition.

Subsequent thermal processing will cause the n-type dopant atoms in the lower 200 angstroms of bottom region 62 to diffuse upward. The 200 angstroms of undoped silicon immediately above acts as a buffer zone into which these dopants can diffuse slowly before reaching the germanium of region 64.

Herner et al., U.S. patent application Ser. No. 10/955,549, "Nonvolatile Memory Cell Without a Dielectric Antifuse Having High- and Low-Impedance States," filed Sep. 29, 2004, hereinafter the '549 application and hereby incorporated by reference, describes a monolithic three dimensional memory array including vertically oriented p-i-n diodes like diode 2 of FIG. 1. As formed, the polysilicon of the p-i-n diode is in a high-resistance state. Application of a programming voltage permanently changes the nature of the polysilicon, rendering it low-resistance. It is believed the change is caused by an increase in the degree of order in the polysilicon, as described more fully in Herner et al., U.S. patent application Ser. No. 11/148,530, "Nonvolatile Memory Cell Operating by Increasing Order in Polycrystalline Semiconductor Material," filed Jun. 8, 2005, hereinafter the '530 application and hereby incorporated by reference. This change in resistance is stable and readily detectable, and thus can record a data state, allowing the device to operate as a memory cell. A first memory level is formed above the substrate, and additional memory levels may be formed above it. These memories may benefit from use of the methods and structures according to embodiments of the present invention.

A related memory is described in Herner et al., U.S. patent application Ser. No. 11/015,824, "Nonvolatile Memory Cell Comprising a Reduced Height Vertical Diode," filed Dec. 17, 2004, hereinafter the '824 application and hereby incorporated by reference. As described in the '824 application, it may be advantageous to reduce the height of the p-i-n diode. A shorter diode requires a lower programming voltage and decreases the aspect ratio of the gaps between adjacent diodes. Very high-aspect ratio gaps are difficult to fill without voids. A thickness of at least 600 angstroms is preferred for the intrinsic region to reduce current leakage in reverse bias of the diode. Forming a diode having a silicon-poor intrinsic layer above a heavily n-doped layer, the two separated by a thin intrinsic capping layer of silicon-germanium, according to a preferred embodiment of the present invention, will allow for sharper transitions in the dopant profile, and thus reduce overall diode height.

Embodiments of the present invention prove particularly useful in formation of a monolithic three dimensional memory array. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

Figure 6:
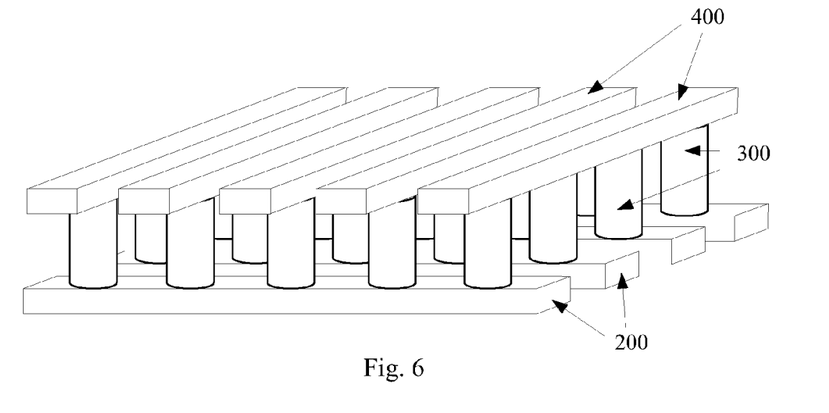
FIG. 6 is a perspective view of a memory level formed according to an embodiment of the present invention.

FIG. 6 shows a portion of a memory level of exemplary memory cells formed according to an embodiment of the present invention, including bottom conductors 200, pillars 300 (each pillar 300 comprising a diode), and top conductors 400. Fabrication of such a memory level, including vertically oriented diodes, each having a bottom silicon-germanium heavily n-doped region, an undoped silicon-germanium capping layer, and an intrinsic region formed of silicon or a germanium-poor silicon-germanium alloy, will be described in detail. More detailed information regarding fabrication of a similar memory level is provided in the '549 and '824 applications, previously incorporated. More information on fabrication of related memories is provided in Herner et al., U.S. Pat. No. 6,952,030, "High-Density Three-Dimensional Memory Cell," owned by the assignee of the present invention and hereby incorporated by reference. To avoid obscuring the invention, not all of this detail will be included in this description, but no teaching of these or other incorporated patents or applications is intended to be excluded. It will be understood that this example is non-limiting, and that the details provided herein can be modified, omitted, or augmented while the results fall within the scope of the invention.

EXAMPLE

Fabrication of a single memory level will be described in detail. Additional memory levels can be stacked, each monolithically formed above the one below it.

Figure 7A:
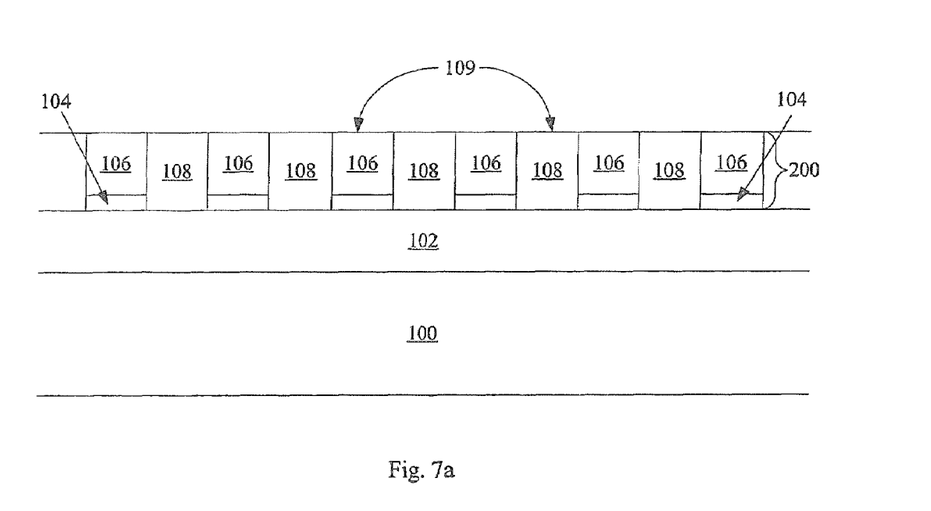
FIGS. 7a-7c are cross-sectional views illustrating stages in formation of a first memory level according to an embodiment of the present invention.

Turning to FIG. 7a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate and insulator. An adhesion layer 104 may be included between the insulating layer 102 and the conducting layer 106 to help the conducting layer 106 adhere. If the overlying conducting layer is tungsten, titanium nitride is preferred as adhesion layer 104.

The next layer to be deposited is conducting layer 106. Conducting layer 106 can comprise any conducting material known in the art, such as tungsten, or other materials, including tantalum, titanium, copper, cobalt, or alloys thereof.

Once all the layers that will form the conductor rails have been deposited, the layers will be patterned and etched using any suitable masking and etching process to form substantially parallel, substantially coplanar conductors 200, shown in FIG. 7a in cross-section extending out of the page. In one embodiment, photoresist is deposited, patterned by photolithography and the layers etched, and then the photoresist removed using standard process techniques. Conductors 200 could be formed by a Damascene method instead.

Next a dielectric material 108 is deposited over and between conductor rails 200. Dielectric material 108 can be any known electrically insulating material, such as silicon dioxide, silicon nitride, or silicon oxynitride. In a preferred embodiment, silicon dioxide is used as dielectric material 108.

Finally, excess dielectric material 108 on top of conductor rails 200 is removed, exposing the tops of conductor rails 200 separated by dielectric material 108, and leaving a substantially planar surface 109. The resulting structure is shown in FIG. 7a. This removal of dielectric overfill to form planar surface 109 can be performed by any process known in the art, such as chemical mechanical planarization (CMP) or etchback. At this stage, a plurality of substantially parallel first conductors have been formed at a first height above substrate 100.

Figure 7B:
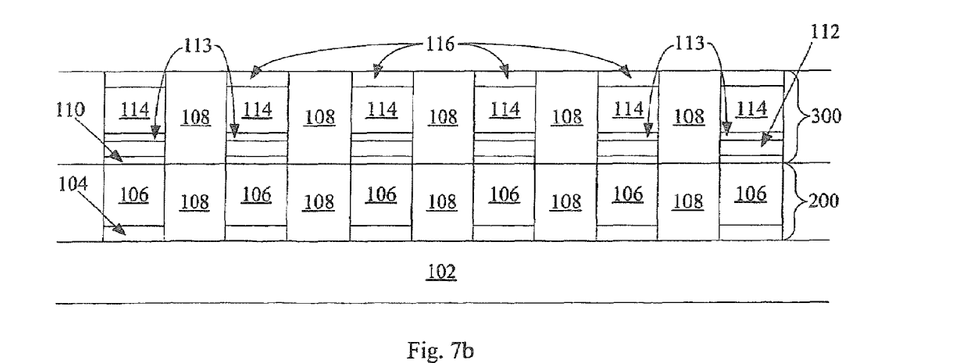

Next, turning to FIG. 7b, vertical pillars will be formed above completed conductor rails 200. (To save space substrate 100 is not shown in FIG. 7b and subsequent figures; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer described earlier.

Next semiconductor material that will be patterned into pillars is deposited. In the present embodiment, the pillar comprises a semiconductor junction diode p-i-n diode having a bottom heavily doped n-type region, a capping layer immediately above, a middle intrinsic region, and a top heavily doped p-type region. The term junction diode is used herein to refer to a semiconductor device with the property of conducting current more easily in one direction than the other, having two terminal electrodes, and made of semiconducting material which is p-type at one electrode and n-type at the other.

The semiconductor material that will form bottom heavily doped n-type layer 112 is deposited first. This semiconductor material is preferably a silicon-germanium alloy which is at least 10 at % germanium to minimize the surface-seeking diffusion of the n-type dopant. Preferably a $Si_{0.8}Ge_{0.2}$ alloy is used. In other embodiments, the germanium content may be higher; for example it may be 25 at %, 30 at %, 50 at %, or more, including 100 at % germanium, with no silicon. In still other embodiments, some other semiconductor material, such as carbon or tin, may be included as a small proportion of the silicon-germanium alloy. Heavily doped layer 112 is preferably doped in situ by flowing an appropriate donor gas which will provide an n-type dopant. Flowing $PH_3$ during deposition will cause phosphorus atoms to be incorporated into layer 112 as it forms. Dopant concentration should be at least about $5 \times 10^{19}$ dopant atoms/cm$^3$, for example between about $5 \times 10^{19}$ and about $3 \times 10^{21}$ dopant atoms/cm$^3$, preferably about $8 \times 10^{20}$ dopant atoms/cm$^3$. Heavily doped layer 112 is preferably between about 50 and about 500 angstroms thick, preferably about 200 angstroms thick.

In less preferred embodiments, heavily doped n-type layer 112 is silicon, a silicon-germanium alloy which is less than about 10 at % germanium, or some other semiconductor material.

Unlike silicon, silicon-germanium tends to deposit heterogeneously on barrier layer 110, initially forming islands rather than a continuous layer. To aid homogeneous deposition of silicon-germanium layer 112, it may be preferred to first deposit a thin seed layer of silicon, for example about 30 angstroms thick, before beginning deposition of silicon-germanium. This very thin layer will not significantly alter electrical behavior of the device. Use of a silicon seed layer to aid deposition of a germanium film is described in Herner, U.S. patent application Ser. No. 11/159,031, "Method of Depositing Germanium Films," filed Jun. 22, 2005, and hereby incorporated by reference.

Next capping layer 113 will be deposited immediately on top of heavily doped n-type layer 112. The flow of the donor gas ($PH_3$, for example) is stopped, so that capping layer 113 is undoped. The substrate is not removed from a deposition chamber between deposition of heavily doped layer 112 and capping layer 113. Preferably capping layer 113 is the same silicon-germanium alloy as heavily doped n-type layer 112, for example $Si_{0.8}Ge_{0.2}$. In other embodiments, capping layer 113 may have a different proportion of germanium, so long as the proportion remains at least 10 at % germanium. For example, the germanium content may drop gradually through capping layer 113. Capping layer 113 is at least about 100 angstroms thick, for example about 200 angstroms thick.

Figure 8A:
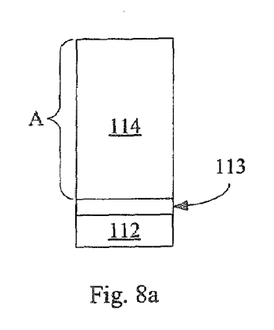
FIGS. 8a-8c are cross-sectional views illustrating loss of silicon thickness during formation of a vertically oriented diode according to an embodiment of the present invention.
Figure 8B:
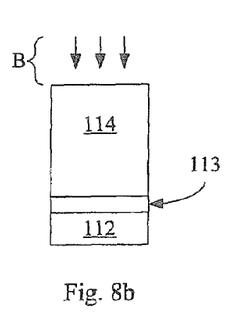
Figure 8C:
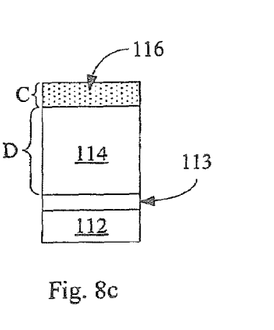

Next intrinsic layer 114 is deposited immediately on top of capping layer 113. Layer 114 is silicon or a silicon-germanium alloy which is less than about 10 at % germanium, for example less than about 5 at % germanium; layer 114 is preferably silicon. In a preferred embodiment heavily doped p-type layer 116 will be formed by ion implantation. Turning to FIG. 8a, intrinsic layer 114 has a deposited thickness A. As shown in FIG. 8b, an upcoming planarization step will remove a thickness B, and, in FIG. 8c, ion implantation to form region 116 will cause a thickness C to be heavily doped. In the finished device intrinsic layer 114 should have thickness D. Thus the thickness A to be deposited is the sum of the ultimate desired thickness D of the intrinsic region 114, the thickness C of heavily doped p-type region 116 to be formed by implantation, and thickness B to be lost during planarization. In the finished device, intrinsic region 114 is preferably between about 600 and about 2000 angstroms, for example about 1600 angstroms. Heavily doped p-type layer 116 is between about 100 and about 1000 angstroms, preferably about 200 angstroms. The amount lost during planarization will most likely be between about 400 and about 800 angstroms, depending on the planarization method used. The thickness to be deposited undoped in this step, then, is between about 1100 and about 3800 angstrom, preferably about 2600 angstroms.

Returning to FIG. 7b, semiconductor layers 114, 113, and 112 just deposited, along with underlying barrier layer 110, will be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the tops of pillars 300 separated by dielectric material 108, and leaving a substantially planar surface.

This removal of dielectric overfill can be performed by any process known in the art, such as CMP or etchback. After CMP or etchback, ion implantation is performed, forming heavily doped p-type top region 116. The p-type dopant is preferably boron or $BF_2$. The resulting structure is shown in FIG. 7b.

As described earlier, the incorporated '539 application describes that the resistivity of the semiconductor material of the diode detectably and permanently changes when subjected to a programming voltage. In some embodiments, a dielectric rupture antifuse, which is intact before programming and is ruptured during programming, may be included in the cell to increase the difference between current flow observed when a read voltage is applied to a programmed vs. an unprogrammed cell.

Figure 7C:
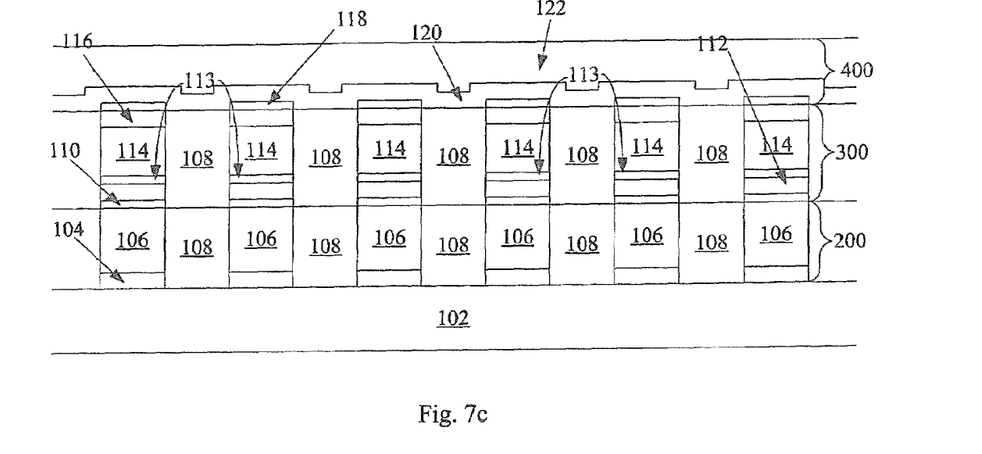

Turning to FIG. 7c, if optional dielectric rupture antifuse 118 is included, it can be formed by any appropriate method, including thermal oxidation of a portion of heavily doped p-type region 116. Alternatively, this layer can be deposited instead, and may be any appropriate dielectric material. For example, a layer of $Al_2O_3$ can be deposited at about 150 degrees C. Other materials may be used. Dielectric rupture anti fuse 118 is preferably between about 20 and about 80 angstroms thick, preferably about 50 angstroms thick. In other embodiments, dielectric rupture antifuse 118 may be omitted.

Top conductors 400 can be formed in the same manner as bottom conductors 200, for example by depositing adhesion layer 120, preferably of titanium nitride, and conductive layer 122, preferably of tungsten. Conductive layer 122 and adhesion layer 120 are then patterned and etched using any suitable masking and etching technique to form substantially parallel, substantially coplanar conductors 400, shown in FIG. 7c extending left-to-right across the page. In a preferred embodiment, photoresist is deposited, patterned by photolithography and the layers etched, and then the photoresist removed using standard process techniques. Each pillar should be disposed between one of the bottom conductors and one of the top conductors; some misalignment can be tolerated.

Next a dielectric material (not shown) is deposited over and between conductor rails 400. The dielectric material can be any known electrically insulating material, such as silicon dioxide, silicon nitride, or silicon oxynitride. In a preferred embodiment, silicon dioxide is used as this dielectric material.

Formation of a first memory level has been described. This memory level comprises a plurality of memory cells, and in each memory cell a pillar is vertically disposed between a bottom conductor and a top conductor, wherein a nonvolatile memory cell comprises a portion of the bottom conductor, the pillar, and a portion of the top conductor. Additional memory levels can be formed above this first memory level. In some embodiments, conductors can be shared between memory levels; i.e. top conductor 400 would serve as the bottom conductor of the next memory level. In other embodiments, an interlevel dielectric (not shown) is formed above the first memory level of FIG. 7c, its surface planarized, and construction of a second memory level begins on this planarized interlevel dielectric, with no shared conductors.

The semiconductor material of pillars 300 and in subsequently formed memory levels is preferably crystallized to form polycrystalline diodes. Preferably after all of the diodes have been formed a final crystallizing anneal is performed.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

The methods and structures of the present invention have been described in the context of a monolithic three dimensional memory array which includes vertically oriented diodes in one or more memory levels. In addition to those patents and applications previously incorporated, the methods of the present invention could advantageously be used in related monolithic three dimensional memory arrays, such as those described in Petti et al., U.S. Pat. No. 6,946,719, "Semiconductor Device Including Junction Diode Contacting Contact-Antifuse Unit Comprising Silicide"; in Petti, U.S. patent application Ser. No. 10/955,387, "Fuse Memory Cell Comprising a Diode, the Diode Serving as the Fuse Element," filed Sep. 29, 2004; and in Hemer et al., U.S. patent application Ser. No. 10/954,510, "Memory Cell Comprising a Semiconductor Junction Diode Crystallized Adjacent to a Silicide," filed Sep. 29, 2004.

In embodiments of the memory arrays described in Herner et al., U.S. patent application Ser. No. 11/125,939, "Rewriteable Memory Cell Comprising a Diode and a Resistance-Switching Material," filed May 9, 2005 and hereinafter the '939 application; and in Herner et al., U.S. patent application Ser. No. 11,287,452, "Reversible Resistivity-Switching Metal Oxide or Nitride Layer With Added Metal," filed Nov. 23, 2005, hereinafter the '452 application, both hereby incorporated by reference, a vertically oriented p-i-n diode (or, in some embodiments, a vertically oriented p-n diode) is paired with a reversible state-change element comprising a resistivity-switching material to form a memory cell. In preferred embodiments the reversible state-change element is formed electrically in series with the diode, vertically disposed between the diode and a top conductor or between the diode and a bottom conductor.

The reversible resistivity-switching material is a resistivity-switching metal oxide or nitride compound, the compound including exactly one metal; for example the resistivity-switching metal oxide or nitride compound may be selected from the group consisting of NiO, $Nb_2O_5$, $TiO_2$, $HfO_2$, $Al_2O_3$, CoO, $MgO_x$, $CrO_2$, VO, BN, and AlN. In some embodiments the layer of resistivity-switching metal oxide or nitride compound includes an added metal. The layer may include an added metal, as described in the '452 application. These memory cells are rewriteable. The reduced reverse leakage current of a p-i-n diode formed according to the present invention may prove particularly advantageous in writing and erasing memory cells in arrays like those of the '939 and '452 applications.

It will be apparent to those skilled in the art, however, that the methods and structures of the present invention may be advantageously employed in any device in which a deposited semiconductor layerstack having a sharp transition in dopant profile above a heavily doped n-type layer is required, particularly if it is preferred that layers deposited on the heavily doped n-type layer have little or no germanium, as when a material having a wider band gap is preferred. The utility of the present invention is in no way limited to vertically oriented diodes, to memory cells, or to monolithic three dimensional memory arrays or structures.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of forming a microelectronic structure, the method comprising:
   forming a first layer comprising semiconductor material that is very heavily n-doped before being annealed, having a first-layer before-anneal dopant concentration, the first layer being between about 50 and 200 angstroms thick, wherein the first layer is formed above a substrate, and wherein the first layer is heavily n-doped after being annealed, having a first-layer after-anneal dopant concentration, the first-layer before-anneal dopant concentration exceeding the first-layer after-anneal concentration;
   forming a second layer comprising semiconductor material that is not heavily doped before being annealed, having a second-layer before-anneal dopant concentration, the second layer being about as thick as the first layer, wherein the second layer is formed above and in contact with the first layer, and wherein the second layer comprises heavily n-doped semiconductor material after being annealed, having a second-layer after-anneal dopant concentration, the second-layer after-anneal dopant concentration exceeding the second-layer before-anneal concentration; and
   forming a third layer comprising semiconductor material that is above and in contact with the second layer and that is not heavily n-doped before or after being annealed, the third layer having a third-layer dopant concentration.

2. The method of claim 1, wherein the first layer and the second layer comprise semiconductor material comprising a similar mixture of semiconductors.

3. The method of claim 2, wherein the first layer and the second layer comprise a silicon-germanium alloy that is at least 10 at % germanium.

4. The method of claim 2, wherein the first layer and the second layer comprise a silicon-germanium alloy that is less than 10 at % germanium.

5. The method of claim 2, wherein the third layer comprises a silicon-germanium alloy that is at least 10 at % germanium.

6. The method of claim 5 wherein the third layer comprises at least 20 at % germanium.

7. The method of claim 5, further comprising:
   forming a fourth layer comprising a semiconductor material that is above and in contact with the third layer and that is not heavily n-doped, wherein the fourth layer comprises silicon or a silicon-germanium alloy that is less than 10 at % germanium.

8. The method of claim 7, wherein the fourth layer comprises no more than 5 at % germanium.

9. The method of claim 1, wherein the first, second, and third layers are portions of a vertically oriented junction diode.

10. The method of claim 9, wherein the diode is a p-i-n diode, and the third layer is undoped or lightly doped.

11. The method of claim 1, further comprising forming a fourth layer comprising a semiconductor material that is above and in contact with the third layer and that is not heavily n-doped, wherein the fourth layer comprises silicon or a silicon-germanium alloy that is less than 10 at % germanium.

12. The method of claim 11, further comprising patterning and etching the first, second, third and fourth layers to form a pillar.

13. The method of claim 11, wherein:
   the fourth layer is heavily p-doped; and the fourth layer is a portion of a vertically oriented junction diode; and
   wherein the third layer comprises a silicon-germanium alloy that is at least 10 at % germanium.

14. The method of claim 13, wherein:
   the diode is vertically disposed between a bottom conductor and a top conductor; and
   wherein a nonvolatile memory cell comprises a portion of the bottom conductor, the diode, and a portion of the top conductor.

15. The method of claim 14, wherein the non-volatile memory cell resides in a monolithic three dimensional memory array, the method further comprising:
   a) forming a first memory level above the substrate, the first memory level comprising:
      i) a plurality of the bottom conductors, the bottom conductors being substantially parallel and substantially coplanar;
      ii) a plurality of the top conductors, the top conductors being substantially parallel and substantially coplanar; and
      iii) a plurality of the non-volatile memory cells; and
   b) forming at least a second memory level monolithically above the first memory level.

16. The method of claim 14, wherein the memory cell further comprises a reversible state-change element, the reversible state-change element disposed between the diode and the bottom conductor or between the diode and the top conductor.

17. The method of claim 16, wherein the reversible state-change element comprises a layer of a resistivity-switching metal oxide or nitride compound selected from the group consisting of $NiO$, $Nb_2O_5$, $TiO_2$, $HfO_2$, $Al_2O_3$, $CoO$, $MgO_x$, $CrO_2$, $VO$, $BN$, and $AlN$.

18. The method of claim 1, wherein the second-layer before-anneal dopant concentration and the third-layer dopant concentration are less than about $5 \times 10^{17}$ dopant atoms/cm$^3$ of an n-type dopant, and wherein the first-layer after-anneal dopant concentration and the second-layer after-anneal dopant concentration are at least about $5 \times 10^{19}$ dopant atoms/cm$^3$.

19. The method of claim 1, further comprising:
   annealing the microelectronic structure.

* * * * *